US009883296B2

(12) United States Patent
Flood

(10) Patent No.: US 9,883,296 B2
(45) Date of Patent: Jan. 30, 2018

(54) FILTER TO SUPPRESS HARMONICS FOR AN ANTENNA

(71) Applicant: Starkey Laboratories, Inc., Eden Prairie, MN (US)

(72) Inventor: Stephen Paul Flood, Eden Prairie, MN (US)

(73) Assignee: Starkey Laboratories, Inc., Eden Prairie, MN (US)

(*) Notice: Subject to any disclaimer, the term of this patent is extended or adjusted under 35 U.S.C. 154(b) by 82 days.

(21) Appl. No.: 14/559,560

(22) Filed: Dec. 3, 2014

(65) Prior Publication Data

US 2016/0165364 A1    Jun. 9, 2016

(51) Int. Cl.
*H04R 25/00* (2006.01)
*H03H 7/38* (2006.01)

(52) U.S. Cl.
CPC ............ *H04R 25/554* (2013.01); *H03H 7/38* (2013.01); *H04R 2225/51* (2013.01)

(58) Field of Classification Search
USPC ...................................... 381/71.11
See application file for complete search history.

(56) References Cited

U.S. PATENT DOCUMENTS

| 6,483,404 | B1 * | 11/2002 | Ammar | ............... H01P 1/20372 333/204 |
| 8,265,312 | B2 | 9/2012 | Zhu et al. | |
| 8,300,863 | B2 | 10/2012 | Knudsen et al. | |
| 8,644,539 | B2 | 2/2014 | Zhu et al. | |
| 2006/0121874 | A1 * | 6/2006 | Block | ................. H04B 1/0458 455/333 |
| 2006/0245518 | A1 * | 11/2006 | Wang | ....................... H03D 7/00 375/316 |
| 2006/0262951 | A1 | 11/2006 | Jun | |
| 2008/0304686 | A1 * | 12/2008 | Meskens | ................. A61N 1/08 381/330 |
| 2010/0277003 | A1 * | 11/2010 | Von Novak | ............. H02J 17/00 307/104 |
| 2013/0307742 | A1 | 11/2013 | Hu et al. | |
| 2014/0010392 | A1 | 1/2014 | Kvist | |

FOREIGN PATENT DOCUMENTS

EP    2076065 B1    1/2014

OTHER PUBLICATIONS

"European Application Serial No. 15197671.9, Extended European Search Report dated Apr. 12, 2016", 8 pgs.
"European Application Serial No. 15197671.9, Communication Pursuant to Article 94(3) EPC dated Aug. 1, 2017", 5 pgs.

* cited by examiner

*Primary Examiner* — Amir Etesam
(74) *Attorney, Agent, or Firm* — Schwegman Lundberg & Woessner, P.A.

(57) ABSTRACT

Disclosed herein, among other things, are systems and methods for filtering to suppress harmonics for a hearing assistance device antenna. One aspect of the present subject matter includes a hearing assistance system for a wearer including a wireless radio frequency (RF) transceiver, an antenna and a filter connected between the RF transceiver and the antenna. According to various embodiments, the filter is configured to suppress harmonics for the antenna, and configured to maintain impedance and prevent inversion of impedance presented to the RF transceiver from the antenna.

20 Claims, 5 Drawing Sheets

FILTER TO SUPPRESS HARMONICS FOR AN ANTENNA

TECHNICAL FIELD

This document relates generally to wireless communication systems and more particularly to a filter to suppress harmonics for an antenna.

BACKGROUND

Modern hearing assistance devices, such as hearing aids, typically include digital electronics to enhance the wearer's listening experience. Hearing aids are electronic instruments worn in or around the ear that compensate for hearing losses by specially amplifying sound. Hearing aids use transducer and electro-mechanical components which are connected via wires to the hearing aid circuitry.

Hearing assistance devices often need to be accessed remotely for fitting and programming of the devices. Data such as configuration parameters and telemetry information can be downloaded and/or uploaded to the hearing assistance devices for the purpose of programming, control and data logging. Additional wireless communication functions such as remote control and streaming audio can be integrated. However, existing antenna interfaces for wireless electronics can be affected by harmonics.

Accordingly, there is a need in the art for improved systems and methods for filtering to suppress harmonics for an antenna.

SUMMARY

Disclosed herein, among other things, are systems and methods for filtering to suppress harmonics for a hearing assistance device antenna. One aspect of the present subject matter includes a hearing assistance system for a wearer including a wireless radio frequency (RF) transceiver, an antenna and a filter connected between the RF transceiver and the antenna. According to various embodiments, the filter is configured to suppress harmonics for the antenna, and configured to maintain impedance and prevent inversion of impedance presented to the RF transceiver from the antenna.

One aspect of the present subject matter includes a method of using a hearing assistance device. The method includes providing a filter connected between an RF transceiver and an antenna of a hearing assistance device, the filter configured to suppress harmonics for the antenna and to maintain impedance presented to the RF transceiver from the antenna.

This Summary is an overview of some of the teachings of the present application and not intended to be an exclusive or exhaustive treatment of the present subject matter. Further details about the present subject matter are found in the detailed description and appended claims. The scope of the present invention is defined by the appended claims and their legal equivalents.

DETAILED DESCRIPTION

Figure 1:
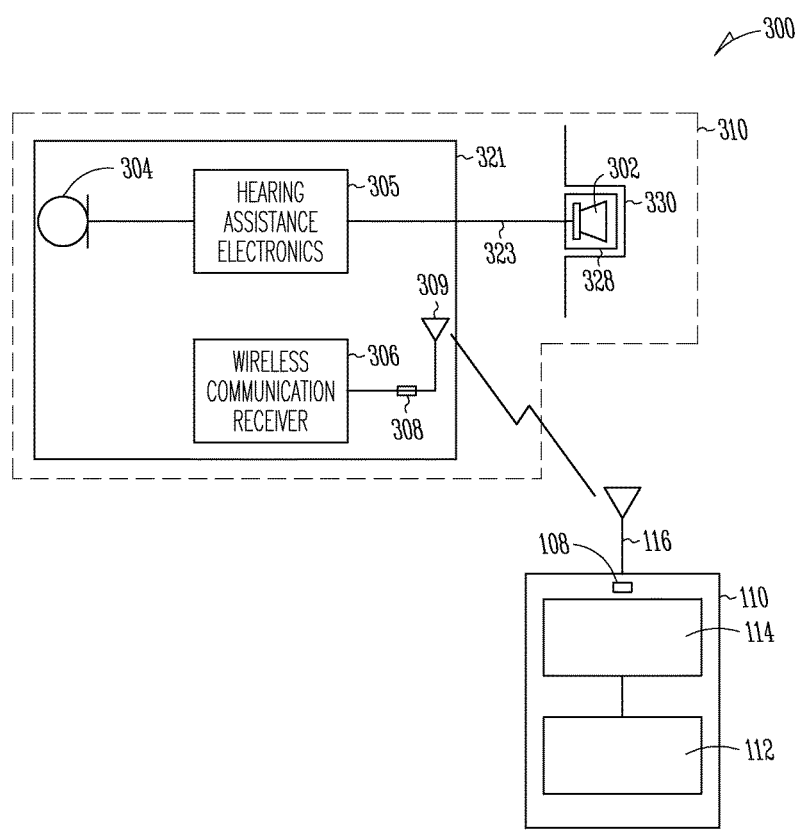
FIG. 1 illustrates a block diagram of a system including a hearing assistance device adapted to be worn by a wearer and an external wireless communication device, according to various embodiments of the present subject matter.

The following detailed description of the present subject matter refers to subject matter in the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

The present detailed description will discuss hearing assistance devices using the example of hearing aids. Hearing aids are only one type of hearing assistance device. Other hearing assistance devices include, but are not limited to, those in this document. It is understood that their use in the description is intended to demonstrate the present subject matter, but not in a limited or exclusive or exhaustive sense.

Various interfaces between an antenna and corresponding wireless communication electronics have been affected by harmonics being at or above allowable FCC specification and other regulatory specifications. Past attempts to implement a harmonic filter for this application have been unsuccessful, since the previous filters transformed the antenna impedance to significantly different levels, such that the transceiver's antenna trim circuitry did not work with these filters. These past attempts included the use of thin film low pass filters and the use of coupled resonators. Thus, the only previous solution was to lower the transmit power of the wireless electronics to reduce harmonics.

Disclosed herein, among other things, are systems and methods for filtering to suppress harmonics for a hearing assistance device antenna. One aspect of the present subject matter includes a hearing assistance system for a wearer including a wireless radio frequency (RF) transceiver, an antenna and a filter connected between the RF transceiver and the antenna. According to various embodiments, the filter is configured to suppress harmonics for the antenna, and configured to maintain impedance prevent inversion of impedance presented to the RF transceiver from the antenna. The combination of a filter that does not invert impedances and the transceiver antenna tuning circuitry allows for higher transmit powers without harmonics exceeding regulatory specification limits. A variety of filter topologies can be used without departing from the scope of the present subject matter, as long as the filter does not employ impedance inversion.

According to various embodiments, the RF transceiver is configured to operate in a 900 MHz band. The RF transceiver is configured to operate using an antenna trim (tuning) circuitry, in various embodiments. The antenna can be any shape or type, but is a resonant loop antenna in one embodiment. The filter can be implemented using low temperature co-fired ceramic (LTCC) technology or thin film technology, in various embodiments. In various embodiments, the filter can be implemented using discrete inductive-capacitive (LC) design on a flex circuit.

In various embodiments, the present subject matter reduces harmonics of a hearing assistance device transmitter (or transceiver). This permits the hearing assistance device to be set to a higher transmit power, providing greater range for wireless communications. The present subject matter also reduces the harmonics of the hearing assistance device transmitter without drastically changing the impedance presented to the transmitter electronics from the antenna. The filter of the present subject matter includes a topology that can be implemented with LTCC or thin film technology, reducing variability in the design and reducing parts count. According to various embodiments, the filter of the present subject matter is a balanced filter. The balanced filter coupled to the balanced output of the wireless communication electronics (or transceiver or transmitter) presents symmetrical impedance to the terminals of the wireless communication electronics. A nonsymmetrical impedance would have the negative impact of increasing even order harmonics. The symmetrical load presented to the wireless communication electronics and will reduce harmonics generated in the electronics as well as attenuate the harmonics that are generated.

FIG. 1 illustrates a block diagram of a system 300, according to the present subject matter. The illustrated system 300 shows an external wireless communication device 110 in wireless communication with a hearing assistance device 310. In various embodiments, the hearing assistance device 310 includes a first housing 321, an acoustic receiver or speaker 302, positioned in or about the ear canal 330 of a wearer and conductors 323 coupling the receiver 302 to the first housing 321 and the electronics enclosed therein. The electronics enclosed in the first housing 321 includes a microphone 304, hearing assistance electronics 305, a wireless communication transceiver 306 and an antenna 307. In various embodiments, the hearing assistance electronics 305 includes at least one processor and memory components. The memory components store program instructions for the at least one processor. In various embodiments, the memory components also store data logged by the hearing assistance device. The program instructions include functions allowing the processor and other components to process audio received by the microphone 304 and transmit processed audio signals to the speaker 302. The speaker emits the processed audio signal as sound in the user's ear canal. In various embodiments, the hearing assistance electronics includes functionality to amplify, filter, limit, condition or a combination thereof, the sounds received using the microphone 304.

In the illustrated embodiment of FIG. 1, the wireless communications transceiver 306 is connected to the hearing assistance electronics 305 and the conductors 323 connect the hearing assistance electronics 305 and the speaker 302. The transceiver 306 is connected to the antenna 309 using a filter 308 of the present subject matter, in various embodiments. The external device 110 includes an antenna 116 connected using a filter 108 of the present subject matter to processing electronics 114 that include a transceiver, in an embodiment. In various embodiments, the external device 110 includes one or more components 112 connected to the processing electronics 114, such as memory components, sensing components or other types of electrical components.

Figure 2:
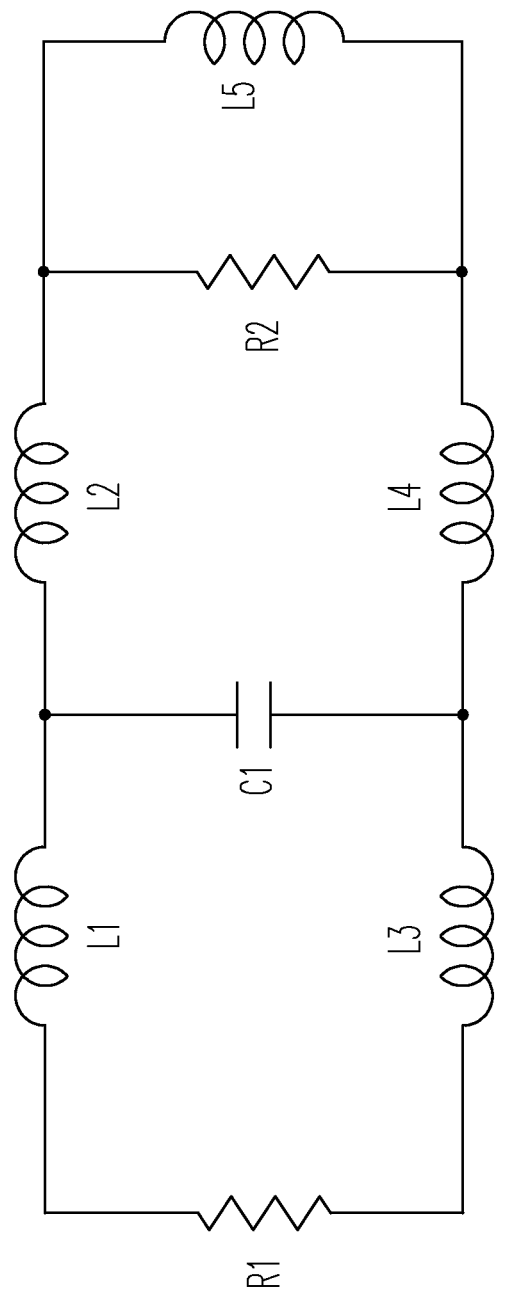
FIG. 2 illustrates a circuit diagram of a filter to suppress harmonics for a hearing assistance device antenna, according to various embodiments of the present subject matter.

FIG. 2 illustrates a circuit diagram of a filter to suppress harmonics for a hearing assistance device antenna, according to various embodiments of the present subject matter. In various embodiments, the present subject matter provides a balanced low pass filter that connects between R1 (a wireless transceiver or wireless electronics) and R2 (antenna). This filter preserves the impedance of the antenna and transfers the antenna impedance to the port of the transceiver. This allows the filter to be inserted between the wireless communications integrated circuit (IC) and the antenna without adversely impacting the antenna tuning circuitry included in the output of the transceiver.

Figure 3:
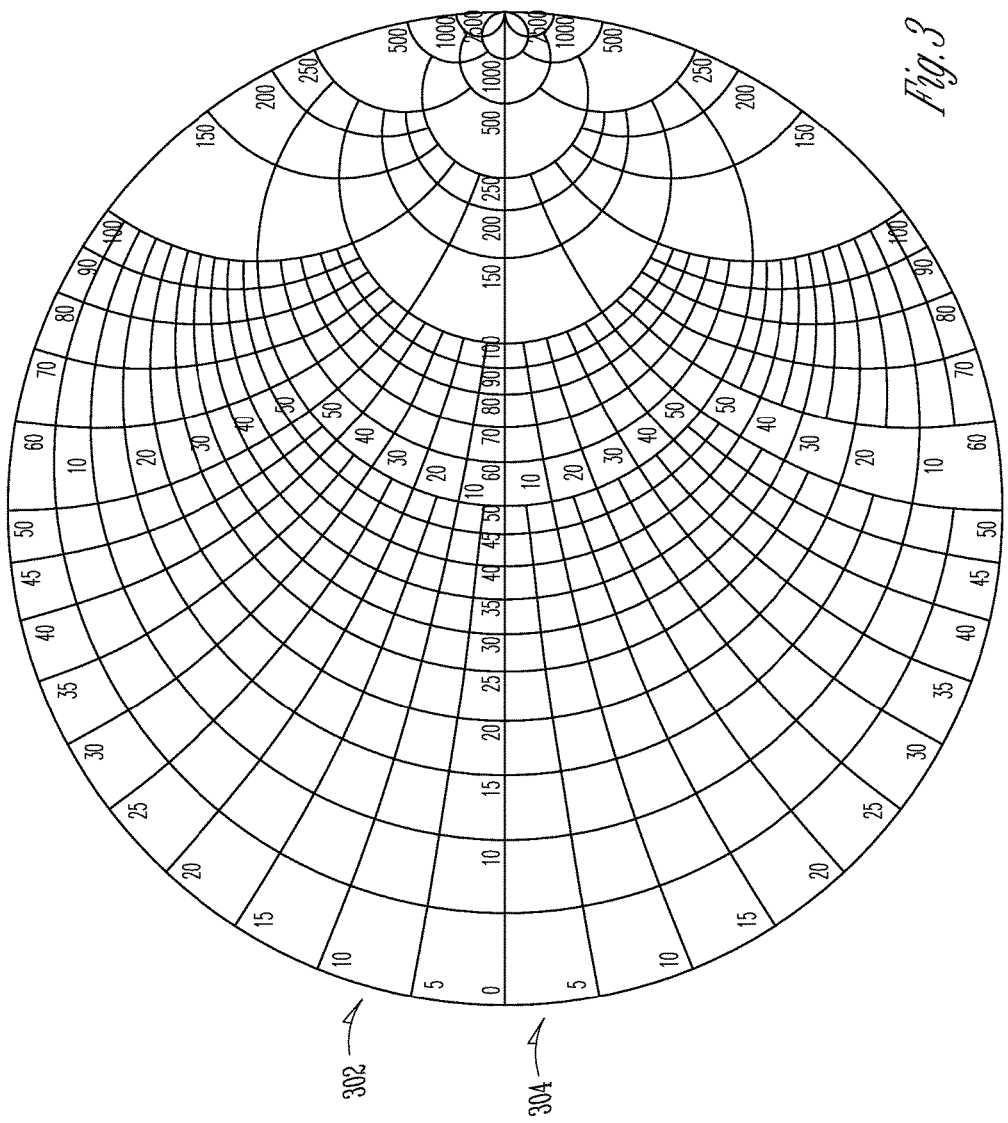
FIG. 3 illustrates a Smith chart of the antenna impedance using a filter to suppress harmonics for a hearing assistance device antenna, according to various embodiments of the present subject matter.

FIG. 3 illustrates a Smith chart of the antenna impedance using a filter to suppress harmonics for a hearing assistance device antenna, according to various embodiments of the present subject matter. This filter approach shifts the antenna impedance (302) the impedance that would be seen by wireless communication electronics (304). This is a subtle shift in impedance on the Smith Chart, which can be optimized. The antenna trim algorithm and hardware in the wireless transceiver are able to tune this slightly shifted impedance. Some filter topologies invert the impedance thus transferring it from the left side to the right side of the Smith Chart, but the filter of the present subject matter avoids this undesirable effect.

Figure 4:
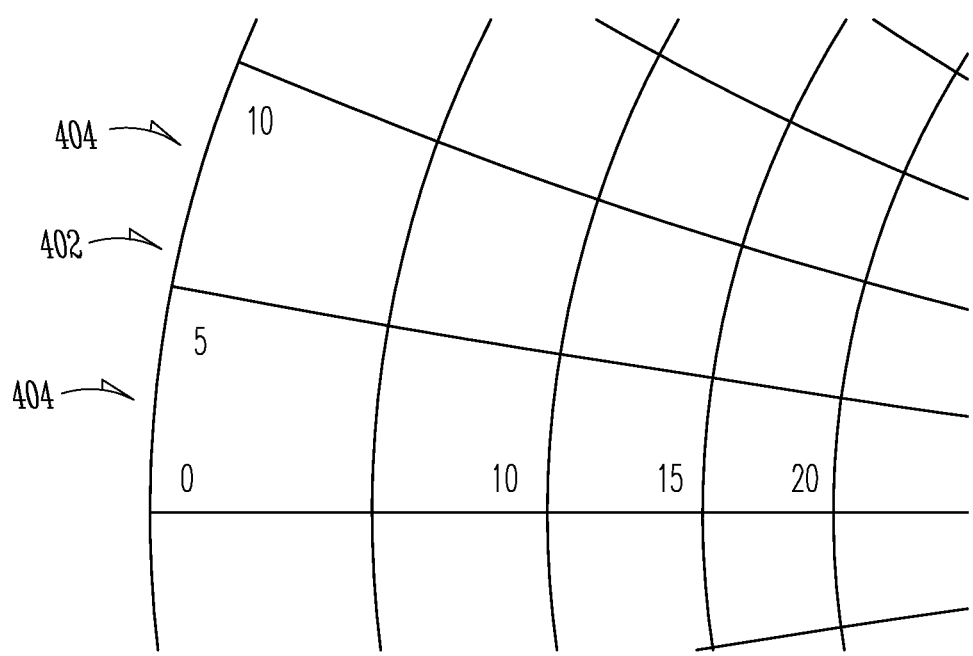
FIG. 4 illustrates one portion of the Smith chart of FIG. 3 after tuning the filter, according to various embodiments of the present subject matter.

FIG. 4 illustrates one portion of the Smith chart of FIG. 3 after tuning the filter, according to various embodiments of the present subject matter. The depicted chart illustrates that tuning the filter yields the impedance seen by the wireless communications electronics using the present filter (404) straddling the original impedance of the antenna (402). As shown in the figure above, the present subject matter uses a balanced low pass filter structure between the wireless communications electronics R1 and the antenna R2 There is a subtle shift in impedance over the 900 MHz band as shown in the figure below.

Figure 5:
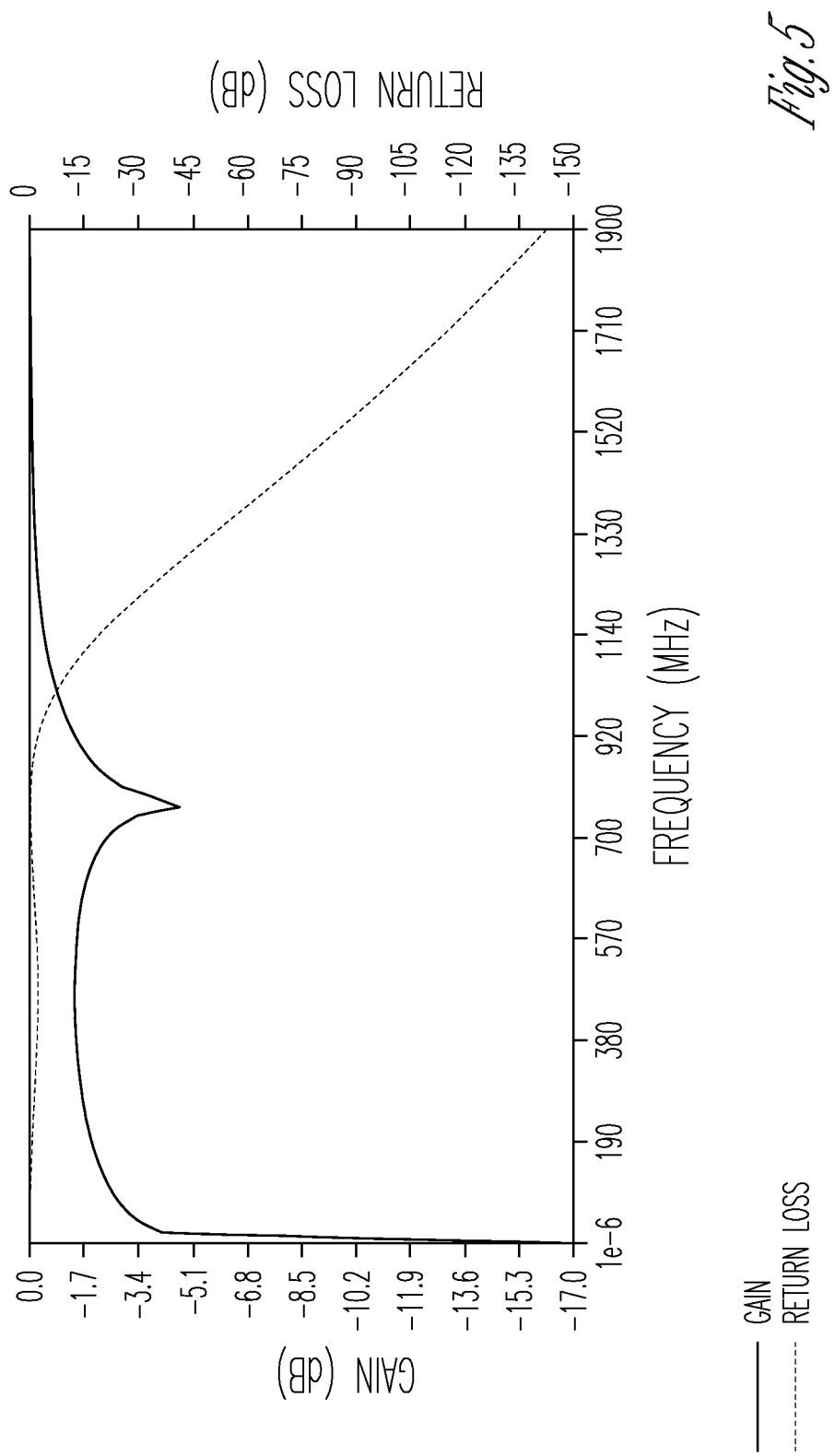
FIG. 5 illustrates a response of a filter to suppress harmonics for a hearing assistance device antenna, according to various embodiments of the present subject matter.

FIG. 5 illustrates a response of a filter to suppress harmonics for a hearing assistance device antenna, according to various embodiments of the present subject matter. This filter will provide significant harmonic rejection for all 900 MHz bands, in various embodiments. Thus, communication electronics can be designed and produced more rapidly with margin to the harmonics. The wireless communication transceiver antenna tune circuitry will not have to be redesigned as the impedance presented to wireless transceiver remains relatively unchanged. In addition, 2.4 GHz products and other frequency ranges will benefit from this approach. In various embodiments, the present subject matter can be used for differentially fed antennas with differential RF inputs to the radio circuitry.

Various embodiments of the present subject matter support wireless communications with a hearing assistance device. In various embodiments the wireless communications can include standard or nonstandard communications. Some examples of standard wireless communications include link protocols including, but not limited to, Bluetooth™, IEEE 802.11 (wireless LANs), 802.15 (WPANs), 802.16 (WiMAX), cellular protocols including, but not limited to CDMA and GSM, ZigBee, and ultra-wideband (UWB) technologies. Such protocols support radio frequency communications and some support infrared communications. Although the present system is demonstrated as a radio system, it is possible that other forms of wireless communications can be used such as ultrasonic, optical, and others. It is understood that the standards which can be used include past and present standards. It is also contemplated that future versions of these standards and new future standards may be employed without departing from the scope of the present subject matter.

The wireless communications support a connection from other devices. Such connections include, but are not limited to, one or more mono or stereo connections or digital connections having link protocols including, but not limited to 802.3 (Ethernet), 802.4, 802.5, USB, ATM, Fibre-channel, Firewire or 1394, InfiniBand, or a native streaming interface. In various embodiments, such connections include all past and present link protocols. It is also contemplated that future versions of these protocols and new future standards may be employed without departing from the scope of the present subject matter.

It is understood that variations in communications protocols, antenna configurations, and combinations of components may be employed without departing from the scope of the present subject matter. Hearing assistance devices typically include an enclosure or housing, a microphone, hearing assistance device electronics including processing electronics, and a speaker or receiver. It is understood that in various embodiments the microphone is optional. It is understood that in various embodiments the receiver is optional. Antenna configurations may vary and may be included within an enclosure for the electronics or be external to an enclosure for the electronics. Thus, the examples set forth herein are intended to be demonstrative and not a limiting or exhaustive depiction of variations.

It is further understood that any hearing assistance device may be used without departing from the scope and the devices depicted in the figures are intended to demonstrate the subject matter, but not in a limited, exhaustive, or exclusive sense. It is also understood that the present subject matter can be used with a device designed for use in the right ear or the left ear or both ears of the wearer.

It is understood that the hearing aids referenced in this patent application include a processor. The processor may be a digital signal processor (DSP), microprocessor, microcontroller, other digital logic, or combinations thereof. The processing of signals referenced in this application can be performed using the processor. Processing may be done in the digital domain, the analog domain, or combinations thereof. Processing may be done using subband processing techniques. Processing may be done with frequency domain or time domain approaches. Some processing may involve both frequency and time domain aspects. For brevity, in some examples drawings may omit certain blocks that perform frequency synthesis, frequency analysis, analog-to-digital conversion, digital-to-analog conversion, amplification, and certain types of filtering and processing. In various embodiments the processor is adapted to perform instructions stored in memory which may or may not be explicitly shown. Various types of memory may be used, including volatile and nonvolatile forms of memory. In various embodiments, instructions are performed by the processor to perform a number of signal processing tasks. In such embodiments, analog components are in communication with the processor to perform signal tasks, such as microphone reception, or receiver sound embodiments (i.e., in applications where such transducers are used). In various embodiments, different realizations of the block diagrams, circuits, and processes set forth herein may occur without departing from the scope of the present subject matter.

The present subject matter is demonstrated for hearing assistance devices, including hearing aids, including but not limited to, behind-the-ear (BTE), in-the-ear (ITE), in-the-canal (ITC), receiver-in-canal (RIC), or completely-in-the-canal (CIC) type hearing aids. It is understood that behind-the-ear type hearing aids may include devices that reside substantially behind the ear or over the ear. Such devices may include hearing aids with receivers associated with the electronics portion of the behind-the-ear device, or hearing aids of the type having receivers in the ear canal of the user, including but not limited to receiver-in-canal (RIC) or receiver-in-the-ear (RITE) designs. The present subject matter can also be used in hearing assistance devices generally, such as cochlear implant type hearing devices and such as deep insertion devices having a transducer, such as a receiver or microphone, whether custom fitted, standard, open fitted or occlusive fitted. It is understood that other hearing assistance devices not expressly stated herein may be used in conjunction with the present subject matter.

This application is intended to cover adaptations or variations of the present subject matter. It is to be understood that the above description is intended to be illustrative, and not restrictive. The scope of the present subject matter should be determined with reference to the appended claims, along with the full scope of legal equivalents to which such claims are entitled.

What is claimed is:

1. A hearing assistance device, comprising:
   a microphone;
   a wireless radio frequency (RF) transceiver including antenna match circuitry;
   hearing assistance electronics connected to the microphone and the RF transceiver;
   an antenna; and
   a balanced low pass filter connected between the antenna match circuitry of the RF transceiver and the antenna such that the low pass filter does not impede the transceiver's ability to tune the antenna, the filter configured to suppress harmonics and attenuate generated harmonics for the antenna to prevent inversion of impedance and to provide a symmetrical impedance load presented to the RF transceiver from the antenna.

2. The device of claim 1, wherein the RF transceiver is configured to operate in a 900 MHz band.

3. The device of claim 1, wherein the RF transceiver is configured to operate using antenna tuning circuitry.

4. The device of claim 1, wherein the antenna is a resonant loop antenna.

5. The device of claim 1, wherein the filter is implemented using low temperature co-fired ceramic (LTCC) technology.

6. The device of claim 1, wherein the filter is implemented using thin film technology.

7. The device of claim 1, wherein the hearing assistance device includes a cochlear implant.

8. The device of claim 1, wherein the hearing assistance device includes a hearing aid.

9. The device of claim 8, wherein the hearing aid includes an in-the-ear (ITE) hearing aid.

10. The device of claim 8, wherein the hearing aid includes a behind-the-ear (BTE) hearing aid.

11. The device of claim 8, wherein the hearing aid includes an in-the-canal (ITC) hearing aid.

12. The device of claim 8, wherein the hearing aid includes a receiver-in-canal (RIC) hearing aid.

13. The device of claim 8, wherein the hearing aid includes a completely-in-the-canal (CIC) hearing aid.

14. The device of claim 8, wherein the hearing aid includes a receiver-in-the-ear (RITE) hearing aid.

15. A method, comprising:
   providing a balanced low pass filter connected between antenna match circuitry of an RF transceiver and an antenna of a hearing assistance device including a microphone and hearing assistance electronics connected to the microphone and the RF transceiver, the filter configured to suppress harmonics and attenuate generated harmonics for the antenna to prevent inversion of impedance and to provide a symmetrical impedance load presented to the RF transceiver from the antenna, wherein the filter does not impede the transceiver's ability to tune the antenna.

16. The method of claim 15, wherein providing a balanced low pass filter includes providing a balanced low pass filter using discrete LC technology.

17. The method of claim 15, wherein the RF transceiver is configured to operate in a 900 MHz band.

18. The method of claim 15, wherein the antenna is a resonant loop antenna.

19. The method of claim 15, wherein providing the filter includes using low temperature co-fired ceramic (LTCC) technology.

20. The method of claim 15, wherein providing the filter includes using thin film technology.

* * * * *